(12) United States Patent
Fujimura et al.

(10) Patent No.: US 9,391,603 B2
(45) Date of Patent: Jul. 12, 2016

(54) SEMICONDUCTOR DEVICE, ELECTRONIC APPLIANCE, AND VEHICLE

(71) Applicant: Rohm Co., Ltd., Kyoto (JP)

(72) Inventors: Takashi Fujimura, Kyoto (JP); Muga Imamura, Kyoto (JP); Hirofumi Yuki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 323 days.

(21) Appl. No.: 14/062,430

(22) Filed: Oct. 24, 2013

(65) Prior Publication Data

US 2014/0117891 A1 May 1, 2014

(30) Foreign Application Priority Data

Oct. 25, 2012 (JP) .................................. 2012-235813

(51) Int. Cl.
*H02P 1/00* (2006.01)
*H03K 17/22* (2006.01)
*H02J 1/06* (2006.01)

(52) U.S. Cl.
CPC . *H03K 17/22* (2013.01); *H02J 1/06* (2013.01); *H03K 2217/0081* (2013.01); *Y02P 80/23* (2015.11); *Y10T 307/469* (2015.04)

(58) Field of Classification Search
CPC ............ H02P 6/001; H02J 1/06; H03K 17/22
USPC ........................................................ 318/139
See application file for complete search history.

(56) References Cited

U.S. PATENT DOCUMENTS

| | | | | |
|---|---|---|---|---|
| 5,761,988 | A * | 6/1998 | Lee ......................... | A47J 27/14 219/432 |
| 2001/0005874 | A1* | 6/2001 | Domon ............... | G06F 13/4282 710/105 |
| 2003/0038673 | A1* | 2/2003 | Koike ...................... | G06F 1/26 327/540 |
| 2004/0227483 | A1* | 11/2004 | Katsumata ........... | H02H 7/0851 318/469 |
| 2011/0161686 | A1* | 6/2011 | Kumagaya ................ | G06F 1/26 713/300 |
| 2013/0021091 | A1* | 1/2013 | Robertson ............. | G06F 1/3203 327/540 |
| 2013/0198539 | A1* | 8/2013 | Furuya ..................... | G06F 1/24 713/310 |

FOREIGN PATENT DOCUMENTS

| | | |
|---|---|---|
| JP | 2005-086853 | 3/2005 |
| JP | 2012-105007 | 5/2012 |

* cited by examiner

*Primary Examiner* — Eduardo Colon Santana
*Assistant Examiner* — Gabriel Agared
(74) *Attorney, Agent, or Firm* — Fish & Richardson P.C.

(57) ABSTRACT

A semiconductor device has a first chip and a second chip sealed in a single package. The first chip includes a regulator which generates an internal voltage from a supply voltage, a reset circuit which monitors the supply voltage and the internal voltage to generate a reset signal, and a controlled circuit which operates by being supplied with the supply voltage. The second chip includes a controlling circuit which generates a control signal for the controlled circuit by being supplied with the internal voltage. The reset signal is fed to both the controlling circuit and the controlled circuit.

16 Claims, 7 Drawing Sheets

SEMICONDUCTOR DEVICE, ELECTRONIC APPLIANCE, AND VEHICLE

CROSS-REFERENCE TO RELATED APPLICATIONS

The present application is based on, and claims priority from, the Japanese Patent Application No. 2012-235813 filed on Oct. 25, 2012, the disclosure of which is hereby incorporated by reference herein in its entirety.

BACKGROUND OF THE INVENTION

1. Field of the Invention

The present invention relates to a multi-chip semiconductor device, and to an electronic appliance and a vehicle employing it.

2. Description of Related Art

FIG. 7 is a block diagram showing a conventional example of a motor driving device. As shown there, in the conventional motor driving device 200, a regulator IC 210 which generates an internal voltage Vreg from a supply voltage Vcc, a driver IC 220 which drives a motor 100 by being supplied with the supply voltage Vcc, and a microprocessor IC 230 which controls the driver IC 220 etc. in a comprehensive fashion by being supplied with the internal voltage Vreg are configured as separate ICs.

Examples of conventional technology related to what has just been mentioned are seen in Japanese Patent Application Publications Nos. 2005-86853 and 2012-105007.

In the conventional motor driving device 200 described above, each IC is furnished with a power muting function dedicated to it (a function for forcibly stopping the operation of the IC in the event of a power drop), so that in the event of a fault in the supply voltage Vcc or the internal voltage Vreg, protective operation is invoked on an IC by IC basis. However, to achieve enhanced stability of the entire system, furnishing each IC with a power muting function dedicated to it is insufficient; for example, when the supply voltage Vcc starts being supplied, an operation sequence needs to have been previously established such that, only after the microprocessor IC 230 becomes ready to operate, the driver IC 220 starts to operate.

Conventional methods for establishing the above-mentioned operation sequence include, for example, a configuration where the power muting for the different ICs are cancelled with shifted timing such that, after the power muting for the microprocessor IC 230 is cancelled, that for the driver IC 220 is cancelled; and a configuration where, while the operation of the microprocessor IC 230 is unstable, an enable signal EN is kept pulled up or down so that the enable signal EN remains at an operation-disabled-state logic level.

However, of these conventional methods, the former requires that the timing with which the power muting for the different ICs is cancelled be controlled with high accuracy with consideration given to signal delays among the ICs and other factors, and this complicates the designing of the circuit. On the other hand, the latter requires that the ICs be externally fitted with a discrete component (a pull-up or pull-down resistor), and this leads to an increased number of components and hence increased cost.

SUMMARY OF THE INVENTION

In view of the above-mentioned inconveniences encountered by the inventors, an object of the present invention is to provide a semiconductor device that provides enhanced safety in the event of a power drop, and to provide an electronic appliance and a vehicle employing such a semiconductor device.

To achieve the above object, according to the present invention, a semiconductor device includes a first chip and a second chip sealed in a single package. The first chip includes a regulator which generates an internal voltage from a supply voltage, a reset circuit which monitors the supply voltage and the internal voltage to generate a reset signal, and a controlled circuit which operates by being supplied with the supply voltage. On the other hand, the second chip includes a controlling circuit which generates a control signal for the controlled circuit by being supplied with the internal voltage. Here, the reset signal is fed to both the controlling circuit and the controlled circuit.

These and other features, elements, steps, benefits, and characteristics of the present invention will become apparent upon further review of the following detailed description of preferred embodiments with reference to the accompanying drawings.

DETAILED DESCRIPTION OF PREFERRED EMBODIMENTS

First Embodiment

Figure 1:
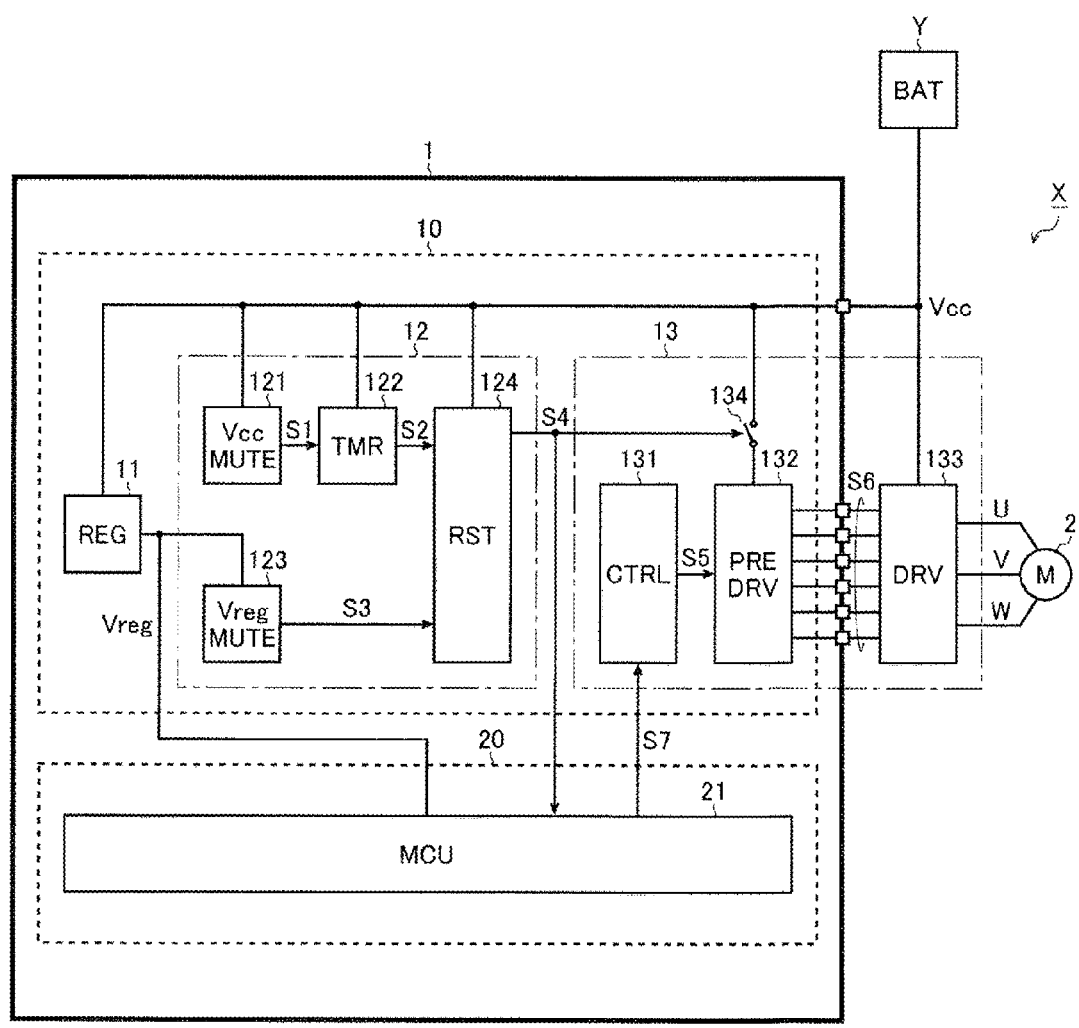
FIG. 1 is a block diagram showing a motor driving device according to a first embodiment of the present invention.

FIG. 1 is a block diagram showing a motor driving device according to a first embodiment of the present invention. The motor driving device 1 according to the first embodiment is a semiconductor device (a so-called vehicle-mounted motor driving IC) that is incorporated, along with a motor 2, into a vehicle-mounted electronic appliance X, and is configured as a MCP (multi-chip package) having an analog chip 10 and a digital chip 20 sealed in a single package.

The following description deals with, as an example, a configuration where a three-phase brushless motor is used as the motor 2. However, this is not meant to limit the type of the motor 2; any other type of motor (such as a DC motor) may be used instead.

The analog chip 10 is a first chip in which mainly analog circuits that handle analog signals are integrated, and includes, for example, a regulator 11, a power-on reset circuit 12, and a motor driving circuit 13.

The regulator 11 generates from a supply voltage Vcc (for example, 12 V) an internal voltage Vreg (for example, 5V).

The power-on reset circuit 12 is an example of a reset circuit that monitors the supply voltage Vcc and the internal voltage Vreg to generate a reset signal S4, and includes a supply voltage monitor 121, a timer 122, an internal voltage monitor 123, and a reset signal generator 124.

The supply voltage monitor 121 monitors the supply voltage Vcc to generate a supply voltage monitor signal S1 (a so-called Vcc mute signal). Specifically, when the supply voltage Vcc is lower their a predetermined threshold level, the supply voltage monitor 121 keeps the supply voltage monitor signal S1 at an abnormal-state logic level (for example, high level); when the supply voltage Vcc is higher than the predetermined threshold level, the supply voltage monitor 121 keeps the supply voltage monitor signal S1 at a normal-state logic level (for example, low level).

The timer 122 delays the supply voltage monitor signal S1 to generate a delayed supply voltage monitor signal S2. Specifically, after the supply voltage monitor signal S1 turns from the abnormal-state logic level to the normal-state logic level, when a predetermined delay time elapses, the timer 122 turns the delayed supply voltage monitor signal S2 from an abnormal-state logic level (for example, low level) to a normal-state logic level (for example, high level).

The internal voltage monitor 123 monitors the internal voltage Vreg to generate an internal voltage monitor signal S3 (a so-called Vreg mute signal). Specifically, when the internal voltage Vreg is lower than a predetermined threshold level, the internal voltage monitor 123 keeps the internal voltage monitor signal S3 at an abnormal-state logic level (for example, low level); when the internal voltage Vreg is higher than the predetermined threshold level, the internal voltage monitor 123 keeps the internal voltage monitor signal S3 at a normal-state logic level (for example, high level).

The reset signal generator 124 generates a reset signal S4 according to the delayed supply voltage monitor signal S2 and the internal voltage monitor signal S3. Specifically, when at least one of the delayed supply voltage monitor signal S2 and the internal voltage monitor signal S3 is at the abnormal-state logic level, the reset signal generator 124 keeps the reset signal S4 at a reset-state logic level (for example, low level); when the delayed supply voltage monitor signal S2 and the internal voltage monitor signal S3 are both at the normal-state logic level, the reset signal generator 124 keeps the reset signal S4 at a non-reset-state logic level (for example, high level).

The motor driving circuit 13 is a circuit block that operates by being supplied with the supply voltage Vcc and the internal voltage Vreg to drive and control the motor 2 according to both the reset signal S4 and an enable signal S7, and includes a controller 131, a pre-driver 132, and a driver 133.

The controller 131 operates by being supplied with the internal voltage Vreg, and generates an energizing control signal S5. Specifically, when the enable signal S7 is at an enabled-state logic level, the controller 131 generates the energizing control signal S5; when the enable signal S7 is at a disabled-state logic level, the controller 131 does not generate the energizing control signal S5. The controller 131 may be fed with a control signal (such as a rotation speed control signal) other than the enable signal S7 from a microprocessor 21.

The pre-driver 132 operates by being supplied with the supply voltage Vcc, and generates a drive signal S6 according to the energizing control signal S5.

The driver 133 operates by being supplied with the supply voltage Vcc, and applies phase voltages U, V, and W to the motor 2 according to the drive signal S6 to generate a drive current for the motor 2. In the motor driving device 1 according to the first embodiment, the driver 133 is fitted externally.

A power switch 134 is a semiconductor device (such as a transistor) that switches the power path to the pre-driver 132 between a conducting state and a cut-off state according to the reset signal S4. Specifically, when the reset signal S4 is at the reset-state logic level (for example, low level), the power switch 134 is kept off so that the power path to the pre-driver 132 remains in a cut-off state. By contrast, when the reset signal S4 is at a non-reset-state logic level (for example, high level), the power switch 134 is kept on so that the power path to the pre-driver 132 remains in a conducting state.

The digital chip 20 is a second chip in which mainly digital circuits that handle digital signals are integrated, and includes, for example, a microprocessor (MCU, micro control unit) 21.

The microprocessor 21 operates by being supplied with the internal voltage Vreg, and controls the operation of the motor driving device 1 in a comprehensive fashion, as by generating the enable signal S7 for the motor driving circuit 13. The relationship between the microprocessor 21 and the motor driving circuit 13 is such that the former acts as a controlling circuit and the latter acts as a controlled circuit.

In the motor driving device 1 configured as described above, a regulator IC, a driver IC, and a microprocessor IC which are conventionally configured as separate ICs are sealed into a single package. This contributes to size reduction and cost reduction in electronic appliances X that incorporate the motor driving device 1.

Moreover, in the motor driving device 1, the reset signal S4 is fed to both the microprocessor 21 and the motor driving circuit 13. That is, the reset signal S4 is fed not only to the microprocessor 21, which acts as a controlling circuit, but is so branched as to be fed also to the motor driving circuit 13, which acts as a controlled circuit.

Thus, the motor driving circuit 13 is permitted to operate only when the reset signal S4 is at the non-reset-state logic level and simultaneously the enable signal S7 is at the enabled-state logic level.

For example, in a situation where the internal voltage Vreg is lower than the predetermined threshold level and the microprocessor 21 is unable to operate normally (a situation where the logic level of the enable signal S7 is indefinite), even if for some cause the enable signal S7 happens to be at the enabled-state logic level, unless the reset signal S4 is at the non-reset-state logic level, no electric power is supplied to the pre-driver 132, and thus the motor driving circuit 13 remains inhibited from operating.

As described above, with the motor driving device 1 according to the first embodiment, the resetting of the microprocessor 21 and the motor driving circuit 13 can be controlled in a fashion unified and coordinated with the result of monitoring of the supply voltage Vcc and the internal voltage Vreg so that, only after the microprocessor 21 becomes ready to operate, the motor driving circuit 13 starts to operate. In this way, it is possible to establish a proper operation sequence of the microprocessor 21 and the motor driving circuit 13 without the need for sophisticated timing control or an externally fitted discrete component as conventionally required; it is thus possible to achieve enhanced safety in the event of a power drop.

Second Embodiment

Figure 2:
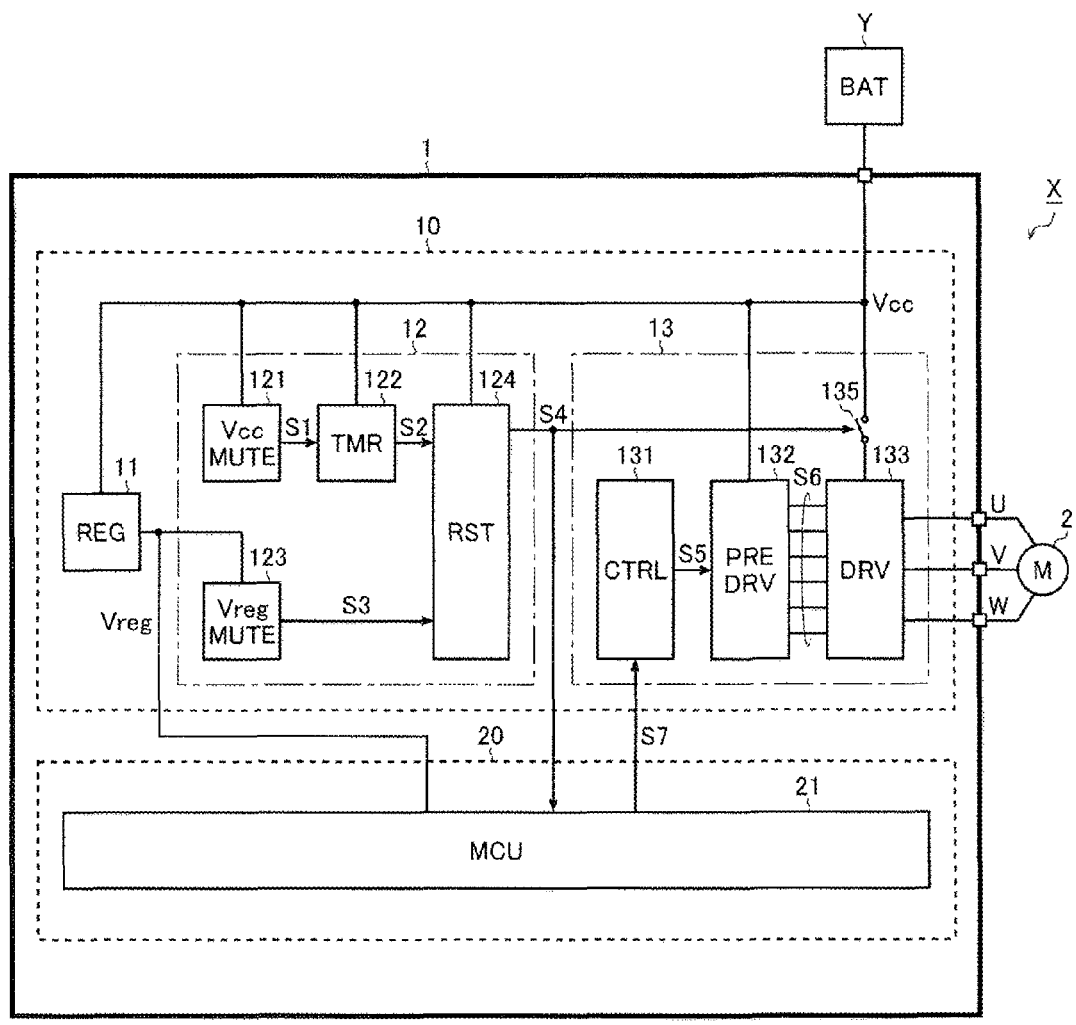
FIG. 2 is a block diagram showing a motor driving device according to a second embodiment of the present invention.

FIG. 2 is a block diagram showing a motor driving device according to a second embodiment of the present invention. The motor driving device 1 according to the second embodiment is configured in almost the same manner as that according to the first embodiment described previously, and differs from it in that the analog chip 10 incorporates the driver 133, and that the power switch 134 is replaced with a power switch 135. The power switch 135 is a semiconductor device that switches the power path to the driver 133 between a conducting state and a cut-off state according to the reset signal S4. Specifically, when the reset signal S4 is at the reset-state logic level (for example, low level), the power switch 135 is kept off so that the power path to the driver 133 remains in a cut-off state. On the other hand, when the reset signal S4 is at the non-reset-state logic level (for example, high level), the power switch 135 is kept on so that the power path to the driver 133 remains in a conducting state. With this configuration, it is possible to reduce the number of components externally fitted to the motor driving device 1, and thus to achieve size reduction and cost reduction in electronic appliances X.

Third Embodiment

Figure 3:
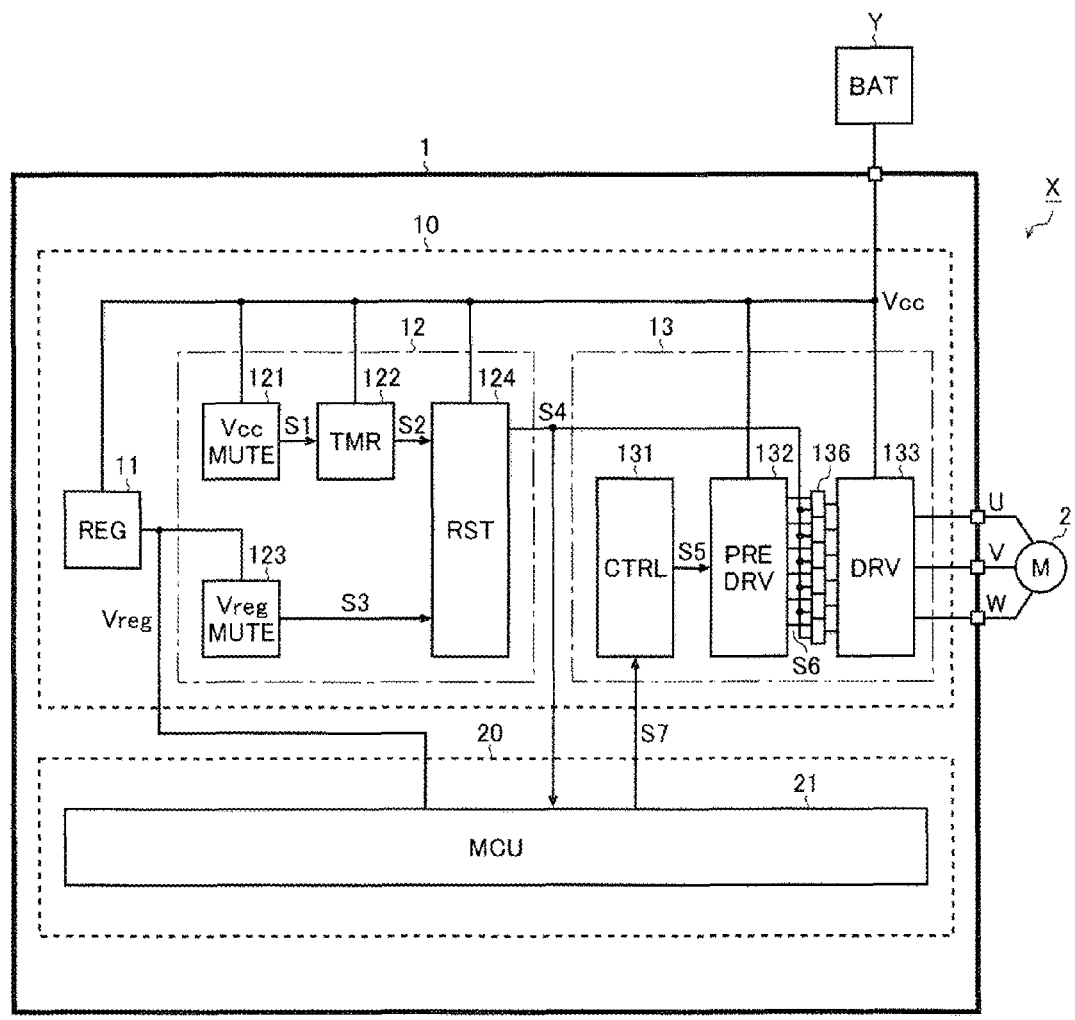
FIG. 3 is a block diagram showing a motor driving device according to a third embodiment of the present invention.

FIG. 3 is a block diagram showing a motor driving device according to a third embodiment of the present invention. The motor driving device 1 according to the third embodiment is configured almost in the same manner as that according to the second embodiment described previously, and differs from it in that the power switch 135 is replaced with a logic gate 136. The logic gate 136 controls masking of the drive signal S6 according to the reset signal S4. Specifically, when the reset signal S4 is at the rest-state logic level (for example, low level), the drive signal S6 is masked so that the driver 133 is inhibited from operating. On the other hand, when the reset signal S4 is at the non-reset-state logic level, the drive signal S6 is not masked, and thus the driver 133 is permitted to operate. With this configuration, there is no need to provide a power switch 135 on the power path to the driver 133, and this eliminates unnecessary energy loss.

Although FIG. 3 shows, as an example, a configuration which is based on the second embodiment (FIG. 2) but which includes the logic gate 136 in place of the power switch 135, this is not meant to limit the configuration of the third embodiment; a configuration based on the first embodiment (FIG. 1) is also possible. In that case, a logic gate that controls masking of the energizing control signal S5 according to the reset signal S4 may be provided.

Power-on Reset Circuit

Figure 4:
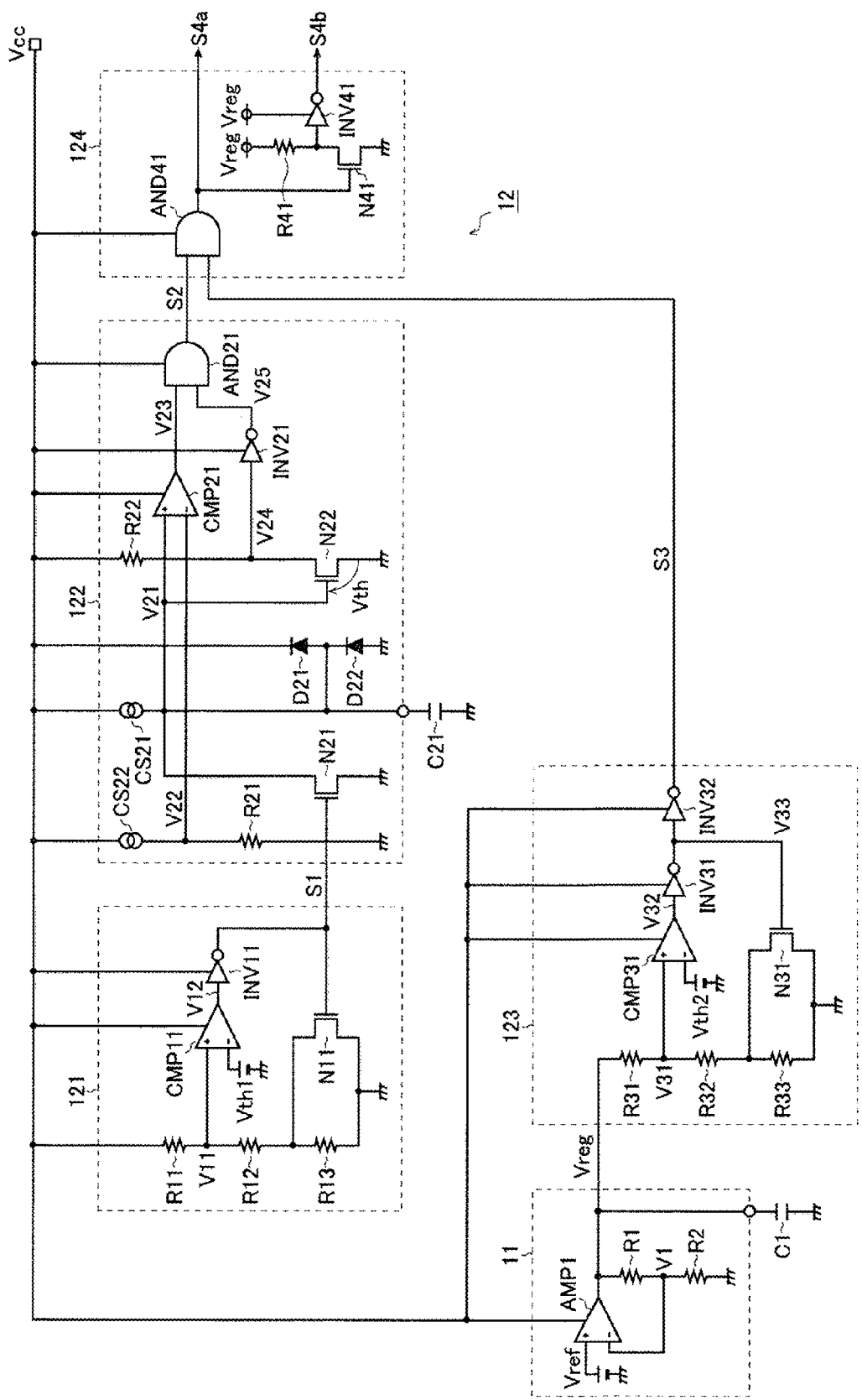
FIG. 4 is a circuit diagram showing an exemplary configuration of a regulator 11 and a power-on reset circuit 12.

FIG. 4 is a circuit diagram showing an exemplary configuration of the regulator 11 and the power-on reset circuit 12 (the supply voltage monitor 121, the timer 122, the internal voltage monitor 123, and the reset signal generator 124).

First, a description will be given of the circuit configuration and operation of the regulator 11. In this exemplary configuration, the regulator 11 includes an operational amplifier AMP1, resistors R1 and R2, and a capacitor C1. The non-inverting input node (+) of the operational amplifier AMP1 is connected to a node to which a reference voltage Vref is applied. The output node of the operational amplifier AMP1 serves as an output node of the internal voltage Vreg. The resistors R1 and R2 are connected in series between the output node of the operational amplifier AMP1 and a ground node. The inverting input node (−) of the operational amplifier AMP 1 is connected to the connection node between the resistors R1 and R2 (a node to which a voltage V1 is applied). The capacitor C1, which is provided outside the analog chip 10, is connected between the output node of the operational amplifier AMP1 and a ground node. The power node of the operational amplifier AMP1 is connected to a node to which the supply voltage Vcc is applied.

In the regulator 11 configured as described above, the operational amplifier AMP 1 performs feedback control with respect to the internal voltage Vreg such that the reference voltage Vref applied to its non-inverting input node (+) remains equal to the voltage V1 (a division voltage of the internal voltage Vreg) applied to its inverting input node (−). Thus, the internal voltage Vreg is kept at a voltage level (=[(R1+R2)/R2]×Vref) commensurate with the reference voltage Vref. It is preferable that the reference voltage Vref be generated from a constant voltage (such as a band-gap voltage) that is insusceptible to fluctuations in power and temperature.

Next, a description will be given of the circuit configuration and operation of the supply voltage monitor 121. In this exemplary configuration, the supply voltage monitor 121 includes resistors R11 to R13, a comparator CMP11, an inverter INV11, and an N-channel MOS (metal oxide semiconductor) field-effect transistor N11. The resistors R11 to R13 are connected in series between a node to which the supply voltage Vcc is applied and a ground node. The non-inverting input node (+) of the comparator CMP11 is connected to the connection node between the resistors R11 and R12 (a node to which a voltage V11 is applied). The inverting input node (−) of the comparator CMP11 is connected to a node to which a threshold voltage Vth1 is applied. The power node of the comparator CMP11 is connected to a node to which the supply voltage Vcc is applied. The input node of the inverter INV11 is connected to the output node of the comparator CMP11 (a node to which a comparison signal V12 is applied). The output node of the inverter INV11 serves as an output node of the supply voltage monitor signal S1. The power node of the inverter INV11 is connected to a node to which the supply voltage Vcc is applied. The source of the transistor N11 is connected to the connection node between the resistors R12 and R13. The source of the transistor N11 is connected to a ground node. The gate of the transistor N11 is connected to the output node of the inverter INV11.

In the supply voltage monitor 121 configured as described above, the resistors R11 to R13 function as a voltage division circuit for generating the voltage V11 (a division voltage of the supply voltage Vcc) commensurate with the supply voltage Vcc. The comparator CMP11 compares the voltage V11 applied to its non-inverting input node (+) with the threshold voltage Vth1 applied to its inverting input node (−) to generate the comparison signal V12. The comparison signal V12 is, when the voltage V11 is higher than the threshold voltage Vth1, at high level and, when the voltage V11 is lower than the threshold voltage Vth1, at low level. The inverter INV11 logically inverts the comparison signal V12 to generate the supply voltage monitor signal S1. Accordingly, the supply voltage monitor signal S1 is, when the voltage V11 is higher than the threshold voltage Vth1, at low level and, when the voltage V11 is lower than the threshold voltage Vth1, at high level.

Immediately after the supply voltage Vcc starts to be supplied, the supply voltage Vcc has not yet reached a predetermined target level, and thus the voltage V11 is lower than the threshold voltage Vth1; this keeps the supply voltage monitor signal S1 at high level. In this state, the transistor N11 is on, and thus the resistor R13 does not take part in the voltage division circuit. Accordingly, the voltage division ratio equals R12/(R11+R12).

Thereafter, when the supply voltage Vcc reaches the target level, the voltage V11 exceeds the threshold voltage Vth1, and thus the supply voltage monitor signal S1 turns to low level. Now, the transistor N11 is off, and thus the resistor R13 takes part in the voltage division circuit. Accordingly, the voltage division ratio is now higher than before, namely (R12+R13)/(R11+R12+R13); thus, the voltage V11 is intentionally raised.

By switching the voltage division ratio of the supply voltage Vcc according to the logic level of the supply voltage monitor signal S1 in this way, it is possible to give the comparator CMP11 hysteresis. It is preferable that the threshold voltage Vth1 mentioned above be generated from a constant voltage (such as a band-gap voltage) that is insusceptible to fluctuations in power and temperature.

Next, a description will be given of the circuit configuration and operation of the timer 122. In this exemplary configuration, the timer 122 includes resistors R21 and R22, current sources CS21 and CS22, a capacitor C21, static protection diodes D1 and D2, a comparator CMP21, N-channel MOS field-effect transistors N21 and N22, an inverter INV21, and a logical multiplication (AND) operator AND21.

The respective first nodes of the current sources CS21 and CS22 are both connected to a node to which the supply voltage Vcc is applied. The second node of the current source CS21 is connected to the first node of the capacitor C21, which is provided outside the analog chip 10. The second node of the capacitor C21 is connected to a ground node. The second node of the current source CS22 is connected to the first node of the resistor R21. The second node of the resistor R21 is connected to a ground node. The non-inverting input node (+) of the comparator CMP21 is connected to the first node of the capacitor C21 (a node to which a voltage V21 is applied). The inverting input node (−) of the comparator CMP21 is connected to the first node of the resistor R21 (a node to which a voltage V22 is applied). The power node of the comparator CMP21 is connected to a node to which the supply voltage Vcc is applied. The drain of the transistor N21 is connected to the first node of the capacitor C21. The source of the transistor N21 is connected to a ground node. The gate of the transistor N21 is connected to a node to which the supply voltage monitor signal S1 is applied. The drain of the transistor N22 is connected to the first node of the resistor R22. The second node of the resistor R22 is connected to a node to which the supply voltage Vcc is applied. The source of the transistor N22 is connected to a ground node. The gate of the transistor N22 is connected to the first node of the capacitor C21 (a node to which a voltage V21 is applied). The input node of the inverter INV21 is connected to the drain of the transistor N22 (a node to which a mask signal V24 is applied). The power node of the inverter INV21 is connected to a node to which the supply voltage Vcc is applied. The first input node of the logical multiplication operator AND21 is connected to the output node of the comparator CMP21 (a node to which an inverted mask signal V25 is applied). The output node of the logical multiplication operator AND21 serves as an output node of the delayed supply voltage monitor signal S2. The power node of the logical multiplication operator AND21 is connected to a node to which the supply voltage Vcc is applied. The anode of the static protection diode D21 and the cathode of the static protection diode D22 are both connected to the first node of the capacitor C21. The cathode of the static protection diode D21 is connected to a node to which is the supply voltage Vcc is applied. The anode of the static protection diode D22 is connected to a ground node.

In the timer 122 configured as described above, the current source CS21 and the capacitor C21 function as a circuit for generating the voltage V21, and the current source CS22 and the resistor R21 function as a circuit for generating the voltage V22. Whereas the voltage level of the voltage V22 is constant, the voltage level of the voltage V21 varies according to the charge state of the capacitor C21.

The transistor N21 functions as a switch for switching the capacitor C21 between a charging state and a discharging state. When the supply voltage Vcc exceeds a predetermined threshold level and the supply voltage monitor signal S1 falls to low level, the transistor N21 turns off; this causes current to pass from the current source CS21 into the capacitor C21. Thus, the voltage V21 increases gradually as the charging of the capacitor C21 proceeds. By contrast, when the supply voltage Vcc drops below the predetermined threshold level and the supply voltage monitor signal S1 rises to high level, the transistor N21 turns on; this causes the first node of the capacitor C21 (a node to which the voltage V21 is applied) to be short-circuited to a ground node, and thus the capacitor C21 discharges rapidly.

The comparator CMP21 compares the voltage V21 applied to its non-inverting input node (+) with the voltage V22 applied to its inverting input node (−) to generate a comparison signal V23. The comparison signal V23 is, when the voltage V21 is higher than the voltage V22, at high level and, when the voltage V21 is lower than the voltage V22, at low level.

The transistor N22 and the resistor R22 function as a simplified voltage comparison circuit for monitoring the voltage V21 to generate the mask signal V24. The inverter INV21 logically inverts the mask signal V24 to generate the inverted mask signal V25. The logical multiplication operator AND21 functions as a logic gate which, when the inverted mask signal V25 is at high level, lets the comparison signal V23 through to output it intact as the delayed supply voltage monitor signal S2 and, when the inverted mask signal V25 is at low level, keeps the delayed supply voltage monitor signal S2 at low level irrespective of the logic level of the comparison signal V23. Thus, the transistor N22, the resistor R22, the inverter INV21, and the logical multiplication operator AND21 function as a masking circuit for invalidating an erroneous pulse in the comparison signal V23 when the supply voltage Vcc starts to be supplied.

Figure 5:
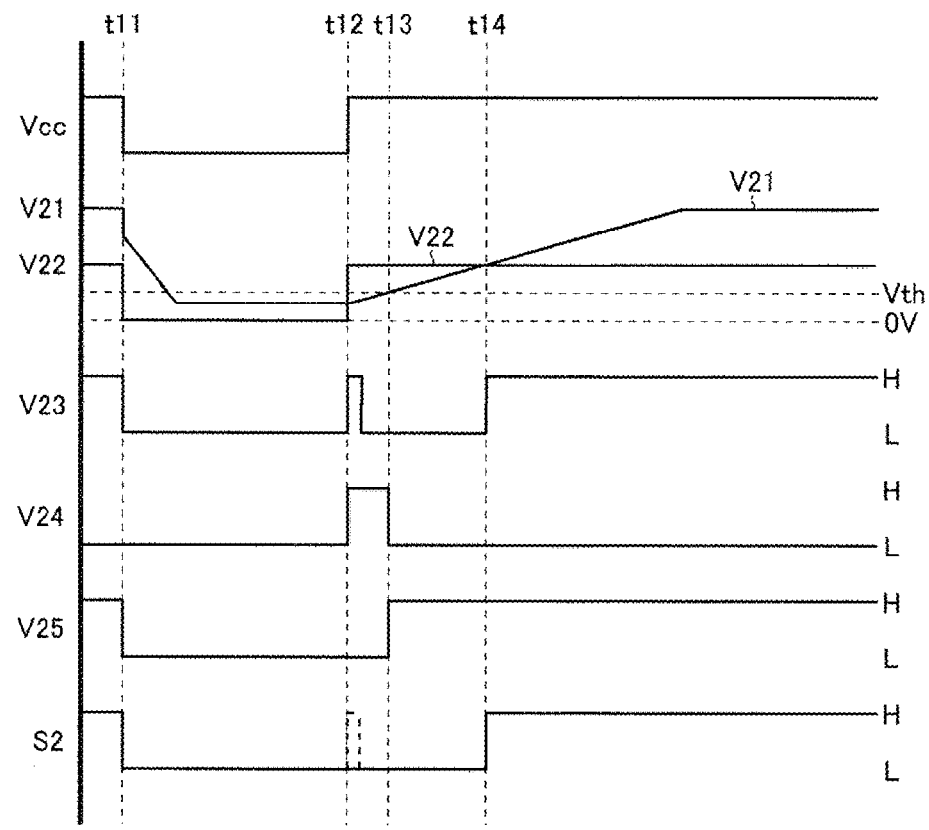
FIG. 5 is a timing chart showing an example of timer operation.

FIG. 5 is a timing chart showing an example of the timer operation, representing, from top down, the supply voltage Vcc, the voltages V21 an V22, the comparison signal V23, the mask signal V24, the inverted mask signal V25, and the delayed supply voltage monitor signal S2.

When, at time point t11, the supply voltage Vcc falls abruptly, the voltage V22, which is generated from the supply voltage Vcc, falls abruptly together. Thus, the comparator CMP21, the inverter INV21, and the logical multiplication operator AND21, which operate by being supplied with the supply voltage Vcc, stop operating immediately. Accordingly, the comparison signal V23, the inverted mask signal V25, and the delayed supply voltage monitor signal S2 also fall abruptly, behaving similarly to the supply voltage Vcc.

On the other hand, the voltage V21 decreases gradually as the electric charge accumulated in the capacitor C21 is discharged. Specifically, when the supply voltage Vcc drops below a predetermined threshold level, the supply voltage monitor signal S1 rises to high level, and thus the transistor N21 turns on; this causes the capacitor C21 to start to discharge. Thereafter, if the supply voltage monitor signal S1 can be kept at high level until the capacitor C21 is discharged completely, the voltage V21 can be left to fall to 0 V.

However, when the supply voltage Vcc happens to fall abruptly, the comparator CMP11 and the inverter INV11. which operate by being supplied with the supply voltage Vcc, stop operating immediately, and this shortens the period for which the supply voltage monitor signal S1 can be kept at high level. Consequently, the transistor N21 remains on for a shorter period, and this prevents the capacitor C21 from discharging completely. When the transistor N21 turns off before the capacitor C21 discharges completely, there remains, as the discharge path for the capacitor C21, only a path that leads to a node to which the supply voltage Vcc is applied by way of the static protection diode D21 (or the body diode of a transistor provided in the current source CS21), which as a result of the fall of the supply voltage Vcc is in a forward-biased state. The discharge path via the static protection diode D21 has a higher impedance than the discharge path via the transistor N21, and accordingly, after the transistor N21 turns off, the voltage V21 decreases comparatively slowly.

Thereafter, when the capacitor C21 discharges until the voltage V21 drops below the forward drop voltage Vf of the static protection diode D21, the static protection diode D21 goes into a reversely-biased state; now, the discharge path via the static protection diode D21, too, is closed. No longer does the capacitor C21 discharge but spontaneously; thus, a voltage V21 slightly lower than the forward drop voltage Vf of the diode remains across the capacitor C21.

Later, when, at time point t12, the supply voltage Vcc starts to be supplied again, the voltage V22, which is generated from the supply voltage Vcc, rises together to the predetermined target level. However, unless at time point t12 the voltage V21 has fallen to 0 V, the voltage V21 temporarily becomes slightly higher than the voltage V22, and this causes an erroneous pulse to appear unintentionally in the comparison signal V23. Such an erroneous pulse may cause the motor driving device 1 to operate improperly. To avoid that, with the masking circuit constituted by the transistor N22, the resistor R22, the inverter INV21, and the logical multiplication operator AND21, an operation for invalidating an erroneous pulse appearing in the comparison signal V23 is performed.

The transistor N22 is on when the voltage V21 is higher than an on threshold voltage vth, and is off when the voltage V21 is lower than the on threshold voltage vth. The on threshold voltage vth may be set at a voltage level higher than the voltage V21 which is expected to remain across, through incomplete discharging of the capacitor C21 (for example, a voltage level equal to the forward drop voltage Vf of the static protection diode D21).

With this configuration, after the supply voltage Vcc starts to be supplied again, until the voltage V21 exceeds the on threshold voltage vth, the transistor N22 remains off. All this while, the mask signal V24 is at high level, and the inverted mask signal V25 is at low level; thus, irrespective of the logic level of the comparison signal V23, the logical multiplication operator AND21 keeps the delayed supply voltage monitor signal 52 at low level, thereby invalidating an erroneous pulse (see the broken lines in the diagram).

On the other hand, when, at time point t13, the voltage V21 exceeds the on threshold voltage vth, the transistor N22 turns on. Now, the mask signal V24 is at low level, and the inverted mask signal V25 is at high level; the logical multiplication operator AND21 thus lets the comparison signal V23 through to output it intact.

Later, when, at time point t14, the voltage V21 exceeds the voltage V22, the comparison signal V23 rises to high level, and the delayed supply voltage monitor signal S2 rises to high level. That is, the timer 122 operates in the following manner: after the supply voltage Vcc exceeds a predetermined threshold level and the supply voltage monitor signal S1 switches its logic level, when a predetermined delay time (the time it takes for the voltage V21 to exceed the voltage V22) elapses, the timer 122 switches the logic level of the delayed supply voltage monitor signal S2.

Although, in this exemplary configuration, the timer 122 includes a simplified voltage comparison circuit employing the transistor N22 and the resistor R22, this is not meant to limit the configuration of the timer 122; a comparator with higher precision may be employed.

Although, in this exemplary configuration, the timer 122 is configured to monitor the voltage V21 to generate the mask signal V24, this is not meant to limit the configuration of the timer 122; it may instead be configured to monitor whether or not the voltage V22 has risen to close to a predetermined target level.

Referring back to FIG. 4, a description will be given of the circuit configuration and operation of the internal voltage monitor 123. The internal voltage monitor 123 includes resistors R31 to R33, a comparator CMP31, inverters INV31 and INV32, and an N-channel MOS field-effect transistor N31. The resistors R31 to R33 are connected in series between a node to which the internal voltage Vreg is applied and a ground node. The non-inverting input node (+) of the comparator CMP31 is connected to the connection node between the resistors R31 and R32 (a node to which a voltage V31 is applied). The inverting input node (−) of the comparator CMP31 is connected to a node to which a threshold voltage Vth2 is applied. The power node of the comparator CMP31 is connected to a node to which the supply voltage Vcc is applied. The input node of the inverter INV31 is connected to the output node of the comparator CMP31 (a node to which a comparison signal V32 is applied). The output node of the inverter INV31 is connected to the input node of the inverter INV32. The output node of the inverter INV32 serves as an output node of the internal voltage monitor signal S3. The power nodes of the inverters INV31 and INV32 are both connected to a node to which the supply voltage Vcc is applied. The drain of the transistor N31 is connected to the connection node between the resistors R32 and R33. The source of the transistor N31 is connected to a ground node. The gate of the transistor N31 is connected to the output node of the inverter INV31 (a node to which an inverted comparison signal V33 is applied).

In the internal voltage monitor 123 configured as described above, the resistors R31 to R33 function as a voltage division circuit for generating the voltage V31 (a division voltage of the internal voltage Vreg) commensurate with the internal voltage Vreg. The comparator CMP31 compares the voltage V31 applied to its non-inverting input node (+) with the threshold voltage Vth2 applied to its inverting input node (−) to generate the comparison signal V32. The comparison signal V32 is, when the voltage V31 is higher than the threshold voltage Vth2, at high level and, when the voltage V31 is lower than the threshold voltage Vth2, at low level. The inverter INV31 logically inverts the comparison signal V32 to generate the inverted comparison signal V33. Accordingly, the inverted comparison signal V33 is, when the voltage V31 is higher than the threshold voltage Vth2, at low level and, when the voltage V31 is lower than the threshold voltage Vth2, at high level. The inverter INV32 logically inverts the inverted comparison signal V33 once again to generate the internal voltage monitor signal S3. Accordingly, like the comparison signal V32, the internal voltage monitor signal S3 is, when the voltage V31 is higher than the threshold voltage Vth2, at high level and, when the voltage V31 is lower than the threshold voltage Vth2, at low level.

Immediately after the internal voltage Vreg starts to be generated, the internal voltage Vreg has not yet reached a predetermined target level, and thus the voltage V31 is lower than the threshold voltage Vth2; this keeps the inverted comparison signal V33 at high level. In this state, the transistor N31 is on, and thus the resistor R33 does not take part in the voltage division circuit. Accordingly, the voltage division ratio equals R32/(R31+R32).

Thereafter, when the internal voltage Vreg reaches the target level, the voltage V31 exceeds the threshold voltage Vth2, and thus the inverted comparison signal V33 turns to low level. Now, the transistor N31 is off, and thus the resistor R33 takes part in the voltage division circuit. Accordingly, the voltage division ratio is now higher than before, namely (R32+R33)/(R31+R32+R33); thus, the voltage V31 is intentionally raised.

By switching the voltage division ratio of the internal voltage Vreg according to the logic level of the inverted comparison signal V33 in this way, it is possible to give the comparator CMP31 hysteresis. It is preferable that the threshold voltage Vth2 mentioned above be generated from a constant voltage (such as a band-gap voltage) that is insusceptible to fluctuations in power and temperature.

Next. a description will be given of the circuit configuration and operation of the reset signal generator 124. In this exemplary configuration, the reset signal generator 124 includes a logical multiplication operator AND41, a resistor R41, an N-channel MOS field-effect transistor N41, and an inverter INV41. The first input node of the logical multiplication operator AND41 is connected to a node to which the delayed supply voltage monitor signal S2 is applied. The second input node of the logical multiplication operator AND41 is connected to a node to which the internal voltage monitor signal S3 is applied. The power node of the logical multiplication operator AND41 is connected to a node to which the supply voltage Vcc is applied. The output node of the logical multiplication operator AND41 serves as an output node of a reset signal S4a (a reset signal that is driven to pulsate between the supply voltage Vcc and a ground voltage GND). The reset signal S4a is used as an on/off control signal for the power switch 134 or 135 and as a masking control signal for the logic gate 136. The gate of the transistor N41 is connected to the output node of the logical multiplication operator AND41. The source of the transistor N41 is connected to a ground node. The drain of the transistor N41 is connected to the first node of the resistor R41. The second node of the resistor R41 is connected to a node to which the internal voltage Vreg is applied. The input node of the inverter INV41 is connected to the drain of the transistor N41. The power node of the inverter INV41 is connected to a node to which the internal voltage Vreg is applied. The output node of the inverter INV41 serves as an output node of a reset signal S4b (a reset signal that is driven to pulsate between the internal voltage Vreg and the ground voltage GND). The reset signal S4b is used, for example, as an initializing signal for the microprocessor 21.

In the reset signal generator 124 configured as described above, the logical multiplication operator AND41 keeps the reset signal S4a at low level when at least one of the delayed supply voltage monitor signal S2 and the internal voltage monitor signal S3 is at low level, and keeps the reset signal S4a at high level when the delayed supply voltage monitor signal S2 and the internal voltage monitor signal S3 are both at high level.

When the reset signal S4a is at low level, the transistor N41 is off, and the input node of the inverter INV41 is pulled up via the resistor R41 to a node to which the internal voltage Vreg is applied; thus, the reset signal S4b remains at low level. By contrast, when the reset signal S4a is at high level, the transistor N41 is on, and the input node of the inverter INV41 is short-circuited to a ground node; thus, the reset signal S4b remains at high level.

In this way, the reset signal generator 124 operates in the following manner: after the supply voltage Vcc exceeds a predetermined target level, when a predetermined time has elapsed, and only when the internal voltage Vreg exceeds a predetermined target level, the reset signal generator 124 raises the reset signals S4a and S4b from low level (the reset-state logic level) to high level (the non-reset-state logic level).

Application to Vehicles

Figure 6:
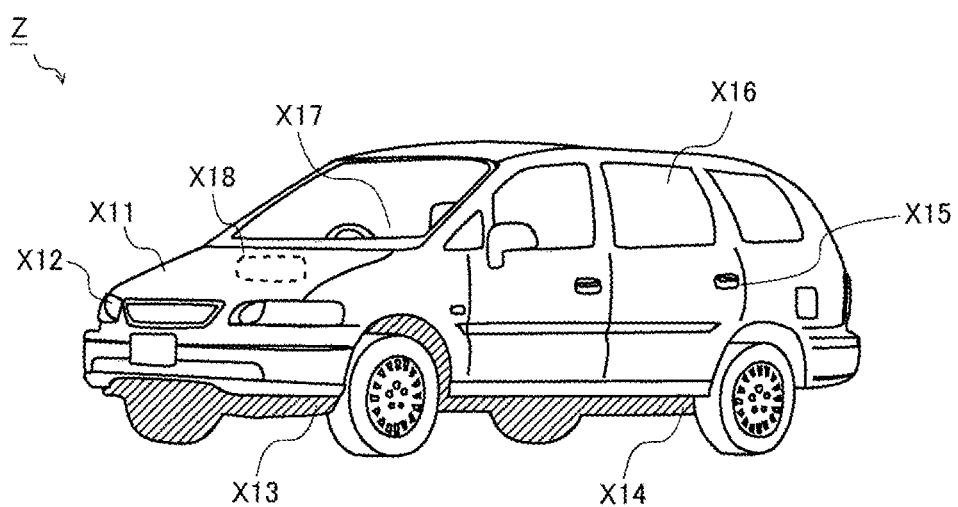
FIG. 6 is an exterior view showing an exemplary configuration of a vehicle incorporating electronic appliances.
Figure 7:
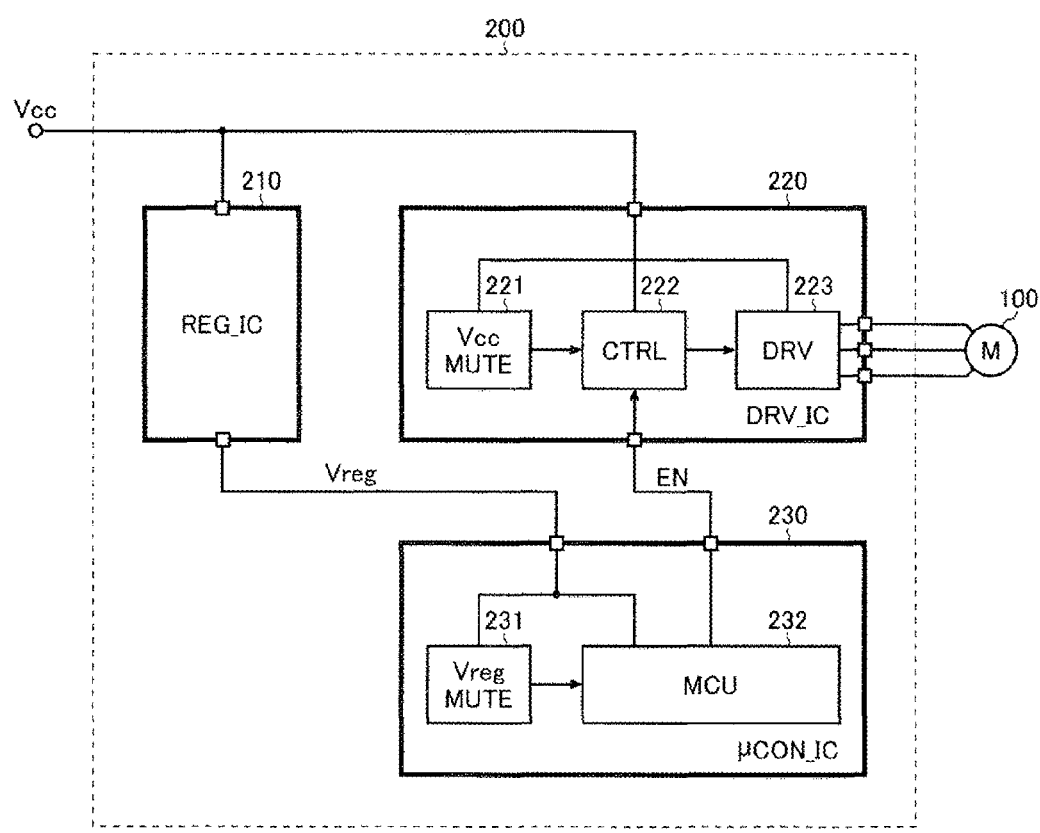
FIG. 7 is a block diagram showing a conventional example of a motor driving device.

FIG. 6 is an exterior view showing an exemplary configuration of a vehicle incorporating various electronic appliances. In this exemplary configuration, the vehicle Z incorporates a battery Y (not shown in FIG. 6) along with various electronic appliances X11 to X18 that operate by being supplied with a supply voltage Vcc from the battery Y. It should be noted that, for the sake of convenient illustration, any of the electronic appliances X11 to X18 shown in FIG. 6 may be located elsewhere in practice.

The electronic appliance X11 is an engine control unit which performs control with respect to an engine (injection control, electronic throttle control, idling control, oxygen sensor heater control, automatic cruise control, etc.).

The electronic appliance X12 is a lamp control unit which controls the lighting and extinguishing of HIDs (high-intensity discharged lamps) and DRLs (daytime running lamps).

The electronic appliance X13 is a transmission control unit which performs control with respect to a transmission.

The electronic appliance X14 is a body control unit which performs control with respect to the movement of the vehicle Z (ABS (anti-lock brake system) control, EPS (electric power steering) control, electronic suspension control, etc.).

The electronic appliance X15 is a security control unit which drives and controls door locks, burglar alarms, and the like.

The electronic appliance X16 comprises electronic appliances incorporated in the vehicle Z as standard or manufacturer-fitted equipment at the stage of factory shipment, such as wipers, power side mirrors, power windows, dampers (shock absorbers), a power sun roof, and power seats.

The electronic appliance X17 comprises electronic appliances fitted to the vehicle Z optionally as user-fitted equipment, such as A/V (audio/visual) equipment, a car navigation system, and an ETC (electronic toll control system).

The electronic appliance X18 comprises high-withstand-voltage electronic appliances provided with a multi-phase motor, such as a vehicle-mounted blower, an oil pump, a water pump, and a battery cooling fan (typically arranged under the rear seats). For example, the motor driving device 1 described previously can be incorporated in this electronic appliance X18.

Modifications

Although the embodiments described above deal with, as examples, configurations where the present invention is applied to a vehicle-mounted motor driving IC, this is not meant to limit the application of the present invention; the present invention finds wide application in multi-chip semiconductor devices in general that has an analog chip and a digital chip sealed in a single package.

Thus, the various technical features disclosed herein may be implemented in any other manner than in the embodiments described above, and allow for many modifications without departing from the spirit of the present invention. That is, the embodiments descried above should be understood to be in every aspect illustrative and not restrictive. The technical scope of the present invention is defined not by the description of the embodiments given above but by the appended claims, and should be understood to encompass any modifications made in the sense and scope equivalent to those of the claims.

INDUSTRIAL APPLICABILITY

The present invention finds application in, for example, motor driving devices that are incorporated in vehicle-mounted electronic appliances to drive and control motors.

LIST OF REFERENCE NUMERALS motor driving device (semiconductor device)
2 motor
10 analog chip (first chip)
11 regulator
12 power-on reset circuit
121 supply voltage monitor
122 timer
123 internal voltage monitor
124 reset signal generator
13 motor driving circuit (controlled circuit)
131 controller
132 pre-driver
133 driver
134, 135 power switch
136 logic gate
20 digital chip (second chip)
21 microprocessor (controlling circuit)
R1, R2, R11-R13, R21, R22, R31-R33, R41 resistor
C1, C21 capacitor
D21, D22 static protection diode
N11, N21, N22, N31, N41 N-channel MOS field-effect transistor
AMP1 operational amplifier
CMP11, CMP21, CMP31 comparator
INV11, INV21, INV31, INV32, INV41 inverter
CS21, CS22 current source
AND21, AND41 logical multiplication operator
X, X11-X18 electronic appliance
Y battery
Z vehicle

What is claimed is:

1. A semiconductor device comprising a first chip and a second chip sealed in a single package, wherein:
the first chip includes a regulator which generates an internal voltage from a supply voltage, a reset circuit which monitors the supply voltage and the internal voltage to generate a reset signal, and a controlled circuit which operates by being supplied with the supply voltage,
the second chip includes a controlling circuit which generates a control signal for the controlled circuit by being supplied with the internal voltage, and
the reset signal is fed to both the controlling circuit and the controlled circuit,
wherein the reset circuit includes:
a supply voltage monitor which monitors the supply voltage to generate a supply voltage monitor signal,
a timer which delays the supply voltage monitor signal to generate a delayed supply voltage monitor signal,
an internal voltage monitor which monitors the internal voltage to generate an internal voltage monitor signal, and
a reset signal generator which generates the reset signal according to the delayed supply voltage monitor signal and the internal voltage monitor signal, wherein:
when at least one of the delayed supply voltage monitor signal or the internal voltage monitor signal is at an abnormal-state logic level, the reset signal generator keeps the reset signal at a reset-state logic level, and
when the delayed supply voltage monitor signal and the internal voltage monitor signal are both at a normal-state logic level, the reset signal generator keeps the reset signal at a non-reset-state logic level.

2. The semiconductor device according to claim 1, wherein the controlled circuit is enabled to operate when the reset signal is at a non-reset-state logic level and simultaneously the control signal is at an enabled-state logic level.

3. The semiconductor device according to claim 2, wherein the reset circuit includes
a supply voltage monitor which monitors the supply voltage to generate a supply voltage monitor signal,
a timer which delays the supply voltage monitor signal to generate a delayed supply voltage monitor signal,
an internal voltage monitor which monitors the internal voltage to generate an internal voltage monitor signal, and
a reset signal generator which generates the reset signal according to the delayed supply voltage monitor signal and the internal voltage monitor signal.

4. The semiconductor device according to claim 3, wherein the controlled circuit is a motor driving circuit which drives and controls a motor.

5. The semiconductor device according to claim 4, wherein the motor driving circuit includes
a controller which generates an energizing control signal according to the control signal,
a pre-driver which generates a drive signal according to the energizing control signal, and
a driver which generates a drive current for the motor according to the drive signal.

6. The semiconductor device according to claim 1, wherein the controlled circuit is a motor driving circuit which drives and controls a motor.

7. The semiconductor device according to claim 6, wherein the motor driving circuit includes
a controller which generates an energizing control signal according to the control signal,
a pre-driver which generates a drive signal according to the energizing control signal, and
a driver which generates a drive current for the motor according to the drive signal.

8. The semiconductor device according to claim 7, wherein the motor driving circuit includes a logic gate which performs masking of the energizing control signal or the drive signal according to the reset signal.

9. The semiconductor device according to claim 7, wherein the motor driving circuit includes a power switch which switches a power path to the driver between a conducting state and a cut-off state according to the reset signal.

10. The semiconductor device according to claim 7, wherein the motor driving circuit includes a power switch which switches a power path to the pre-driver between a conducting state and a cut-off state according to the reset signal.

11. An electronic appliance comprising:
the semiconductor device according to claim 6; and
a motor which is driven and controlled by the semiconductor device.

12. A vehicle comprising:
the electronic appliance according to claim 11; and
a battery which supplies the electronic appliance with a supply voltage.

13. The semiconductor device according to claim 1, wherein the controlled circuit is a motor driving circuit which drives and controls a motor.

14. The semiconductor device according to claim 13,
wherein the motor driving circuit includes
a controller which generates an energizing control signal according to the control signal,
a pre-driver which generates a drive signal according to the energizing control signal, and
a driver which generates a drive current for the motor according to the drive signal.

15. The semiconductor device according to claim 2,
wherein the controlled circuit is a motor driving circuit which drives and controls a motor.

16. The semiconductor device according to claim 15,
wherein the motor driving circuit includes
a controller which generates an energizing control signal according to the control signal,
a pre-driver which generates a drive signal according to the energizing control signal, and
a driver which generates a drive current for the motor according to the drive signal.

* * * * *